(12) United States Patent
Remmers et al.

(10) Patent No.: US 12,119,422 B2
(45) Date of Patent: Oct. 15, 2024

(54) SYSTEMS AND METHODS FOR ENCAPSULATING AN ELECTRONIC COMPONENT

(71) Applicant: H.B. Fuller Company, St. Paul, MN (US)

(72) Inventors: Peter Remmers, Hamburg (DE); Volker K. Kestler, Wrestedt (DE); Thomas F. Kauffman, Woodbury, MN (US)

(73) Assignee: H.B. Fuller Company, St. Paul, MN (US)

( * ) Notice: Subject to any disclaimer, the term of this patent is extended or adjusted under 35 U.S.C. 154(b) by 227 days.

(21) Appl. No.: 17/593,073

(22) PCT Filed: Mar. 6, 2020

(86) PCT No.: PCT/US2020/021531
§ 371 (c)(1),
(2) Date: Sep. 8, 2021

(87) PCT Pub. No.: WO2020/185615
PCT Pub. Date: Sep. 17, 2020

(65) Prior Publication Data
US 2022/0181511 A1 Jun. 9, 2022

Related U.S. Application Data

(60) Provisional application No. 62/815,799, filed on Mar. 8, 2019.

(51) Int. Cl.
*H01L 21/67* (2006.01)
*H01L 31/048* (2014.01)
*H01L 31/18* (2006.01)

(52) U.S. Cl.
CPC ........ *H01L 31/18* (2013.01); *H01L 21/67126* (2013.01); *H01L 31/0481* (2013.01)

(58) Field of Classification Search
None
See application file for complete search history.

(56) References Cited

U.S. PATENT DOCUMENTS

| 3,756,196 A | 9/1973 | Furuuchi et al. |
| 6,042,675 A | 3/2000 | Kim |
| (Continued) | | |

FOREIGN PATENT DOCUMENTS

| WO | WO2008014492 | 12/2008 |
| WO | WO2013000648 | 1/2013 |
| WO | WO2013138564 | 9/2013 |

OTHER PUBLICATIONS

Robert A. Pasquale, Methods for Closed Loop Coating Thickness Control, Presentation, 2007, Hawthorn, NJ.
(Continued)

*Primary Examiner* — Asok K Sarkar
(74) *Attorney, Agent, or Firm* — Daniel J. Barta; Kirsten Stone

(57) ABSTRACT

A method of encapsulating an electronic component. The method includes applying a first layer of an encapsulating composition onto an electronic component from an applicator roll, the electronic component being disposed on a substrate. The applicator roll comprises an outer surface and is spaced apart from the electronic component such that a gap exists between the applicator roll and the electronic component. The gap controls the thickness of the first layer of encapsulating composition. The first layer of encapsulating composition encapsulates the electronic component on
(Continued)

the substrate. An interface between the surface of the electronic component and the encapsulating composition being substantially free of voids.

14 Claims, 10 Drawing Sheets

(56) References Cited

U.S. PATENT DOCUMENTS

| | | |
|---|---|---|
| 6,456,815 B1 | 9/2002 | Odell et al. |
| 7,669,547 B2 | 3/2010 | Jacobson et al. |
| 8,158,450 B1 | 4/2012 | Sheats et al. |
| 9,868,130 B2 | 1/2018 | Rooijmans et al. |
| 2004/0244829 A1 | 12/2004 | Rearick et al. |
| 2007/0295385 A1 | 12/2007 | Sheats et al. |
| 2007/0295387 A1 | 12/2007 | Adriani et al. |
| 2010/0297798 A1 | 11/2010 | Adriani et al. |

OTHER PUBLICATIONS

Abbott, SJ, Kapur, N, Sleigh, PA, Summers, JL and Thompson, HM (2011) A review of the fluid mechanics of rigid roll coating systems. Convertech & e-Print, 1 (2). 47-51 (5).

Cohu, O. & Benkreira, H., Air Entrainment in Angled Dip Coating, Journal—Chemical Engineering Science, 0009-2509, Elsevier LTD 1998.

Johnson, Mitchell A., "Viscoelastic Roll Coating Flows" (2003), Electronic Theses and Dissertations. 235, http://digitalcommons.library.umaine.edu/ etd/235.

SYSTEMS AND METHODS FOR ENCAPSULATING AN ELECTRONIC COMPONENT

FIELD

The present disclosure relates to encapsulating at least one component in an encapsulating composition.

BACKGROUND

In general, one process that can be used to construct an electronic device includes encapsulating electronic components on a substrate. The electronic components can be encapsulated on the substrate by placing a pre-formed film on top of the electronic components and then placing the substrate with the electronic components and the film into an oven. The oven can be used to heat the film, causing it to soften. The softened film can be shaped over the electronic component, and allowed to cool and solidify, After solidifying, the film may encapsulate the electronic components on the substrate. When using a pre-formed film that is to be heated for subsequent shaping over the component to be encapsulated, often the film must be self-supporting to allow handling of the film before heating. When using a film that is thick enough to be self-supporting, the film in some instances may have enough weight that there is the risk of damaging the electronic components during the process. For example, electronic components formed of brittle material may be susceptible to damage from shock or impact that may occur when positioning a pre-formed film, particularly one with suitable thickness to be self-supporting. Additionally, in order for a pre-formed film to be self-supporting, the film often will have a certain thickness, which may lead to the resulting encapsulation layer being undesirably thick. Using a pre-formed film may also lead to voids or bubbles being formed within the encapsulating film, for example, between the encapsulation layer and the components to be encapsulated, as a result of gas being trapped between the film and the component to be encapsulated during the encapsulation process. The encapsulation process sometimes includes a vacuum step during which gas is removed from within the encapsulating material while the encapsulating material is still soft. A vacuum step can be undesirable as it often adds additional steps to an encapsulation process.

Photovoltaic cells are often formed of brittle wafers and can include silicon or glass. As a result, photovoltaic cells are susceptible to damage from scratches, shock, and impact. In the past, forming photovoltaic cells into a photovoltaic array, such as solar array, required attaching photovoltaic cells to a backing (e.g., a substrate), placing a pre-formed film on top of the cells and then placing the entire configuration (i.e., the substrate with the photovoltaic cells and the pre-formed film) into an oven. In the oven, the film was heated, which caused it to melt and form over the cells so as to encapsulate the photovoltaic cells. When using a pre-formed film in this way, there is a risk of damaging the photovoltaic cells. Using pre-formed films may result in an encapsulation layer having an undesirable thickness.

There is a need for a method of encapsulating components (e.g., electronic components) that does not damage the component being encapsulated and that produces articles in which the interface between the component and the encapsulating composition is free of voids.

SUMMARY

Disclosed herein is a method of encapsulating a component. The method includes applying a first layer of an encapsulating composition onto a component from an applicator roll, the component being disposed on a substrate. The applicator roll includes an outer surface and is spaced apart from the component such that a gap exists between the applicator roll and the component. The gap controls the thickness of the first layer of encapsulating composition. The first layer of encapsulating composition encapsulates the component on the substrate. An interface between the surface of the electronic component and the encapsulating composition is substantially free of voids. The method can provide encapsulated articles that exhibit minimal voids or are free of voids.

In some aspects, applying the first layer includes passing the substrate past the applicator roll and turning the applicator roll in the same direction as a direction of travel of the substrate. In some aspects, a tangential speed of the applicator roll is greater than a linear speed of the substrate. In some aspects, applying the first layer includes passing the substrate past the applicator roll in a first direction and turning the applicator roll in a direction opposite the first direction. In some aspects, the method further comprises heating the first layer of encapsulating composition after applying the first layer of encapsulating composition. In some aspects, applying the first layer includes passing the substrate past the applicator roll at a velocity no greater than 0.5 meter per minute.

The component may be an electronic component. In some aspects, the size of the gap defined between the electronic component and the applicator roll is about 0.2 mm. In some aspects, the first layer of the encapsulating composition exhibits a thickness of about 0.2 mm. In some aspects, the application temperature of the encapsulating composition is from about 120° C. to about 170° C. In some aspects, the application temperature of the encapsulating composition is no greater than 120° C. In some aspects, the application temperature of the encapsulating composition is no greater than 100° C. In some aspects, the encapsulating composition is at least one of polypropylene, ethylene vinyl acetate, and an amorphous poly alpha olefin. In some aspects, the electronic component is a semiconductor device.

Disclosed herein is a method of encapsulating an electronic component on a surface of a substrate. The method includes applying a first layer of an encapsulation composition onto a substrate from an applicator roll. The applicator roll includes an outer surface and is spaced apart from the substrate such that a gap exists between the applicator roll and the substrate. The gap controls the thickness of the first layer of encapsulation composition. The method includes positioning an electronic component on the first layer of encapsulation composition. The method includes applying a second layer of encapsulation composition onto the electronic component from the applicator roll, such that the electronic component is encapsulated within the encapsulating composition and the encapsulating composition is substantially free of voids.

In some aspects, applying the first layer of encapsulating composition includes controlling the size of a gap defined between an outer surface of the applicator roll and the surface of the substrate, such that the applicator roll does not contact the substrate. In some aspects, applying the second layer of encapsulating composition includes controlling the size of a gap defined between an outer surface of the applicator roll and the surface of the substrate, such that the applicator roll does not contact the electronic component. In some aspects, the first layer of encapsulating composition defines a first thickness that is less than a thickness of the electronic device. In some aspects, the second layer of encapsulating composition defines a second thickness that is less than a thickness of the electronic device.

In some aspects, applying the first layer of encapsulating composition includes passing the substrate past the applicator roll in a first direction and turning the applicator roll in the same direction as the first direction. In some aspects, a tangential speed of the applicator roll is greater than a linear speed of the substrate. In some aspects, applying the first layer of encapsulating composition includes passing the substrate past the applicator roll in a first direction and turning the applicator roll in a direction opposite the first direction. In some aspects, the method further comprises heating the first layer of encapsulating composition after applying the first layer of encapsulating composition on the substrate. In some aspects, the encapsulating composition is applied as a liquid. In some aspects, the application temperature of the encapsulating composition is from about 120° C. to about 170° C. In some aspects, the application temperature of the encapsulating composition is no greater than 120° C. In some aspects, the application temperature of the encapsulating composition is no greater than 100° C. In some aspects, the first layer of encapsulating composition defines a first thickness, and wherein the positioning step further comprises positioning the electronic component in the first thickness of the encapsulating composition.

Disclosed herein is a system for encapsulating an electronic component. The system includes an applicator roll defining an outer surface configured to apply an encapsulating composition to a surface of a substrate. The system further includes a support structure configured to advance the substrate past the applicator roll. The system further includes an elevator configured to control the size of a gap defined between the surface of the substrate and the outer surface of the applicator roll. The applicator roll is configured to apply the encapsulating composition onto an electronic component positioned along the surface of the substrate without the applicator roll contacting the electronic component. The applicator roll is configured to apply an encapsulating composition onto an electronic component such that the encapsulating composition is substantially free of voids.

In some aspects, the support structure is configured to move a substrate in a direction tangent to a circumference of the applicator roll, and the elevator is configured to move the substrate in a direction radial to the circumference of the applicator roll. In some aspects, the elevator is configured to control a thickness of a layer of encapsulating composition deposited by the applicator roll by controlling the size of the gap. In some aspects, the system further comprises a heating element configured to heat an encapsulating composition disposed on a substrate.

Disclosed herein is an electronic article including an electronic component having an exterior surface and an encapsulating composition in direct contact with the exterior surface of the electronic component. The area of contact between the encapsulating composition and the exterior surface of the electronic article defines an interface, and the interface is substantially free of voids. The encapsulating composition is selected from the group consisting of a thermoplastic composition exhibiting a viscosity of from 500 centipoise (cP) to no greater than 50,000 cP at 150° C., and a cured composition derived from silane-modified thermoplastic polymer, vinyl modified styrenic block copolymer, vinyl modified hydrogenated styrenic block copolymer, acrylate polymer, and combinations thereof.

In some aspects, the thermoplastic composition includes silane-modified amorphous polyalphaolefin, silane-modified metallocene catalyzed polyolefin, silane-modified acrylate, or a combination thereof. In some aspects, the thermoplastic composition includes a hot melt adhesive composition comprising a thermoplastic polymer and at least one of a tackifying agent, a plasticizer, and a wax.

Disclosed herein is an encapsulation process that does not require forming a pre-formed film and does not require heating a pre-formed film in an oven to melt and encapsulate a component. This disclosure includes an encapsulation processes that provides an encapsulation layer with a relatively lower coat weight relative to the coat weight of an encapsulation layer formed from a pre-formed film.

While multiple embodiments are disclosed, still other embodiments of the present disclosure will become apparent to those skilled in the art from the following detailed description, which shows and describes illustrative embodiments of the disclosure. Accordingly, the drawings and detailed description are to be regarded as illustrative in nature and not restrictive.

GLOSSARY

As used herein the phrase "substantially free of voids" means that no voids having a cross sectional dimension greater than 0.1 mm are present and that on average from 0 to no greater than 20 voids are present for each square millimeter of encapsulation composition.

As used herein the term "void" means a space occupied by a gas (e.g., air, oxygen, nitrogen, carbon dioxide, and combinations thereof).

DETAILED DESCRIPTION

The process of encapsulating a component includes applying a liquid encapsulating composition on a component that is positioned on a substrate so as to encapsulate the component within the encapsulating composition and to produce an encapsulated article in which the interface between the encapsulating composition and the component is substantially free of voids. The interface is the area of direct contact between the component and the encapsulating composition.

The liquid encapsulating composition is applied to the component from an applicator roll that is spaced apart from the component such that a gap exists between the applicator roll and the component. The gap controls the thickness of the layer of encapsulating composition formed from the liquid encapsulating composition. The process optionally includes coating a substrate with a first liquid encapsulating composition to form a first layer and contacting the first layer with the component prior to applying a layer of liquid encapsulating composition on the component. Multiple layers of encapsulating composition can be coated on at least one of the substrate and the component. Where multiple layers of encapsulating composition are present, the layers can be formed from the same or different encapsulating composition. In addition, where multiple layers of encapsulating composition have been applied, at least two of the layers optionally fuse together to from a single layer. Any number of layers of encapsulating composition having any suitable coat weight can be applied to achieve a desired total coating thickness.

The process can be carried out as an in-line process. The process may be carried out as consecutive steps as the substrate and the component to be encapsulated proceed through a processing line without the need to remove them from the processing line.

Figure 1A:
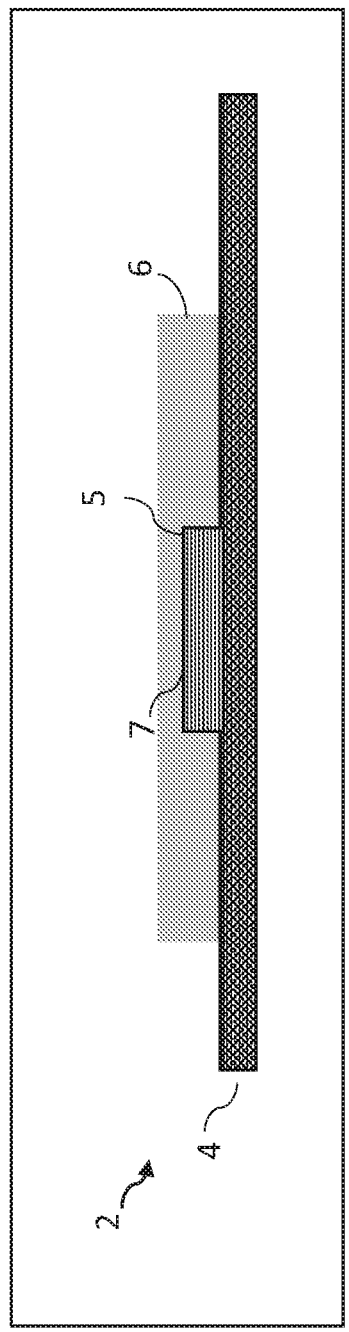
FIGS. 1A and 1B are schematic views of an encapsulated article, in accordance with certain embodiments.
Figure 1B:
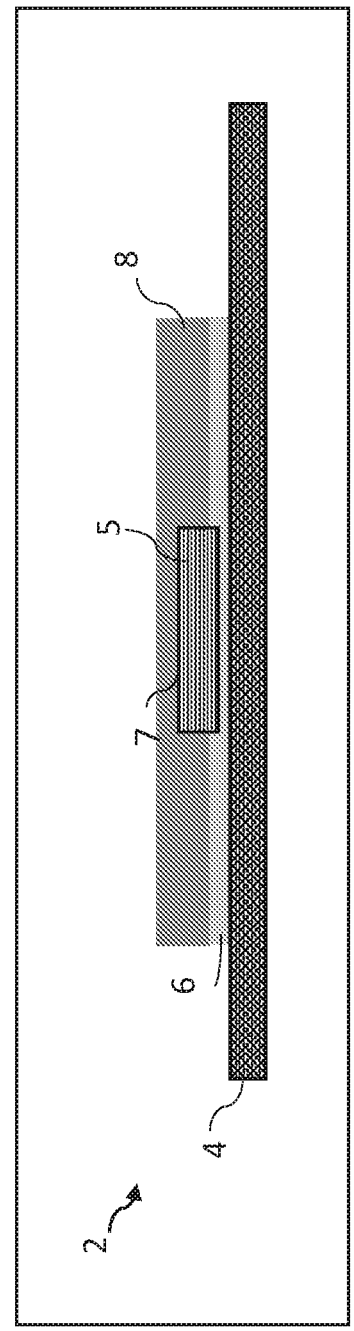

As shown in FIG. 1A, an encapsulated article 2 includes a substrate 4, a component 5, and a first layer 6 of encapsulating composition disposed on the component 5 and the substrate 4. The component 5 is completely encapsulated by the first layer 6 of encapsulating composition and an interface 7 is defined between the encapsulating composition and the component 5. The interface 7 is substantially free of voids. FIG. 1B shows the substrate 4 coated with the first layer 6 of encapsulating composition and the component 5 positioned on the first layer 6. As shown, the encapsulated article 2 includes the substrate 4, the first layer 6 of encapsulating composition disposed on the substrate 4, the component 5, and a second layer 8 of encapsulating composition disposed on the component 5 and the substrate 4. The component 5 is completely enclosed within the first layer 6 and second layer 8 of encapsulating composition and positioned on a surface of the substrate 4 such that the component 5 "floats" above the surface of the substrate 4. In other words, the component 5 may be completely enclosed within the encapsulating composition, and the first layer 6 of encapsulating composition separates the component 5 and the substrate 4. The substrate 4 and the component 5 are attached to each other via the first layer 6 of encapsulating composition.

The component 5 and the substrate 4 may be mechanically or chemically connected by the first layer 6 of encapsulating composition with the component 5 and the substrate 4 free from direct contact with each other. The component 5 may be attached to the substrate 4 via the first layer 6 of encapsulating composition, and electrically insulated from the substrate 4 by the first layer 6 of encapsulating composition. In some examples, the component 5 may be separated from the substrate 4 by the first layer 6 of encapsulating composition, and the component 5 can be electrically connected to the substrate 4, such as with a wire. The encapsulating composition may be electrically conductive such that the component 5 may be in electronic communication with the substrate 4 by the encapsulating composition.

The component 5 may be an electronic component. The component 5 may include one or more electronic components. The component 5 may include a plurality of electronic components, for example, positioned to form an array. For example, the component 5 may include a plurality of photovoltaic cells positioned along the substrate 4 to form a photovoltaic array. The component 5 may be one or more electronic components that are in electronic communication with each other, such as with a wire connecting the one or more electronic components with each other. In a further example, the component 5 may be one or more electronic components that are in electronic communication with each other and with the substrate 4, such as with a wire connecting the one or more electronic components with each other and the substrate 4, or through an electrically conductive encapsulating composition.

Any suitable system for coating a liquid composition on a substrate may be used with the process of encapsulating the component within the encapsulating composition including, e.g., roll coating systems, meniscus coating systems, and other systems suitable for applying a liquid composition to a substrate. The system also can be used as part of a process that is generally referred to as roll coating. Suitable commercially available roll coating systems are available under a variety of under the trade designations including, e.g., HARDO T150 roll coating systems available from Hardo (Bad Salzuflen, Germany) OMMA HGS 314 roll coating systems available from Omnia (Limbiate, Italy), and HARDO-THERMO 650 roll coating systems that include a shuttle system such as a PU SHUTTLE available from Hardo (Bad Salzuflen, Germany). Additional examples of suitable roll coating systems include roller coating lines such as single-sided and double-sided roller coating systems, roller coating systems for anti-light reflective coating, and multifunctional coating systems suitable examples of which are available from Robert Burkle GmbH (Freudenstadt, Germany).

Figure 2:
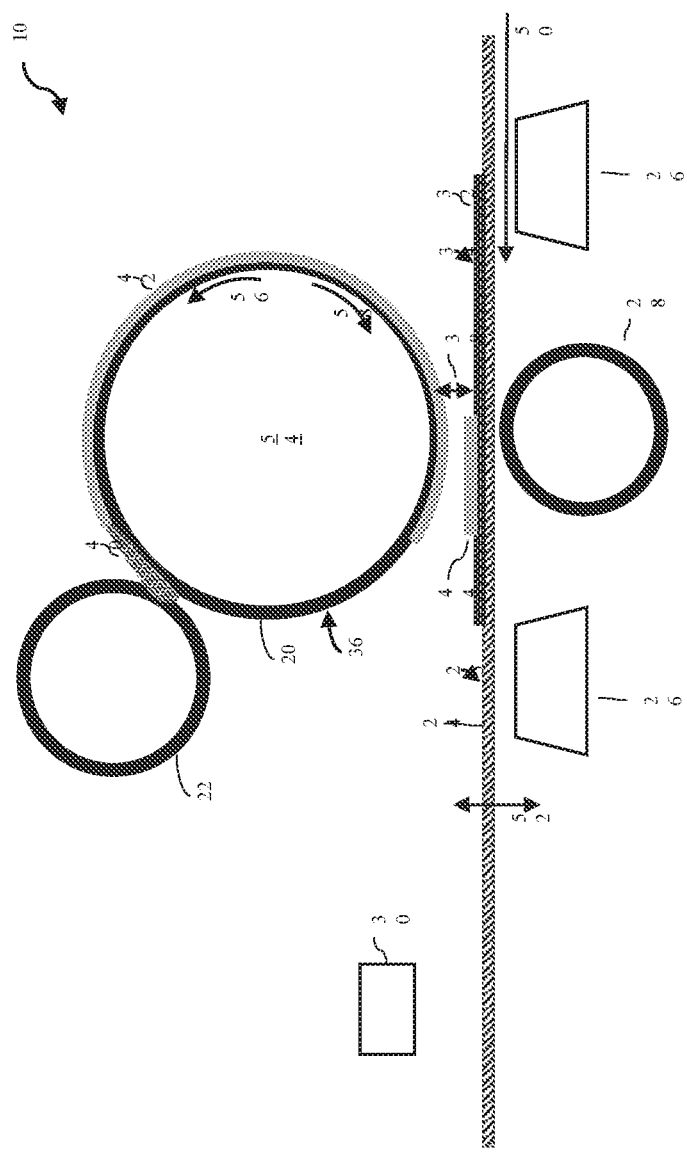
FIG. 2 is a schematic view of a system for applying an encapsulating composition, in accordance with certain embodiments.

FIG. 2 is a schematic view of a system 10 for coating a component with an encapsulating composition. As shown in FIG. 2, one example of the system 10 for use with the process of one or more encapsulating components includes an applicator roll 20, a feed device 22, a support structure 24, an elevator 26, an optional nip roll 28 and an optional heating element 30. The applicator roll 20 defines a central axis 54 and an outer surface 36. The support structure 24 defines a support surface 25. A substrate 32 is positioned on the support structure 24. The substrate 32 defines a first surface 34.

A feed supply 40 of encapsulating composition is positioned between the feed device 22 and the applicator roll 20, an applicator layer 42 of encapsulating composition is positioned along the outer surface 36 of the applicator roll 20, and a first layer 44 of encapsulating composition is positioned along the first surface 34 of the substrate 32.

The feed device 22 is positioned proximate to the applicator roll 20. The feed device 22 can be any device suitable for supplying encapsulating composition as a liquid, including e.g., a roll, a nozzle, a blade, a nip, or any similar device for supplying liquid encapsulating composition to the outer surface 36 of the applicator roll 20. The feed device 22 optionally includes an extruder, for example an extruder that can provide a liquid encapsulating composition and feed it to the applicator roll 20, for example through a slot nozzle or as a curtain. In general, the feed device 22 configured to provide the teed supply 40 of encapsulating composition to the applicator roll 20. In some embodiments, the feed device 22 is configured to provide encapsulating composition at a volumetric feed rate suitable for maintaining a bulk volume of encapsulating composition between the feed supply 40 and the applicator roll 20. For example, the feed supply 40 may be a bulk volume such as a pool of encapsulating composition.

In some embodiments, the feed device 22 is configured to control a thickness of the encapsulating composition that is disposed along the outer surface 36 of the applicator roll 20. For example, the applicator layer 42 may define a thickness as measured from the outer surface 36 of the applicator roll 20 to the outermost point of the applicator layer 42 measured in the radial direction from the outer surface 36. The feed device 22 may control the thickness of the applicator layer 42 by controlling a volumetric feed rate of encapsulating composition to the applicator roll 20. In some instances, a suitable volumetric feed rate of encapsulating composition from the feed device 22 may provide the feed supply 40 and maintain a bulk volume of encapsulating composition between the feed device 22 and the applicator roll 20. The applicator roll 20 can take up encapsulating composition as the applicator roll 20 rotates and the outer surface 36 passes through the feed supply 40 that is maintained as a bulk volume. In some instances, the thickness of the applicator layer 42 may be determined by certain process parameters, such as the tangential speed of the applicator roll 20, or certain characteristics of the encapsulating composition, such as temperature, viscosity, wettability, or surface tension. Additionally or alternatively, the feed device 22 controls the thickness of the applicator layer 42 by regulating how the encapsulating composition is provided to the outer surface 36, such as spreading the applicator layer 42 onto the applicator roll 20. For example, the feed device 22 may be used to lay the encapsulating composition onto the applicator roll 20 and mechanically spread the applicator layer 42 to form a suitable thickness. In some embodiments, the feed device 22 is configured to provide the encapsulating composition while the encapsulating composition is at a temperature from about 100° C., 110° C., 120° C., about 130° C., or about 140° C., to about 150° C., about 160° C., about 170° C., or about 200° C., or a temperature between any pair of the foregoing values, although additional temperatures are further contemplated.

The applicator roll 20 is generally shaped as a cylinder that defines the central axis 54, and defines the outer surface 36 as oriented in a radial direction from the central axis 54. The applicator roll 20 may define a length as measured in the direction along the central axis 54, e.g. along the longitudinal axis. The applicator roll 20 is configured to receive encapsulating composition from the feed supply 40, carry the encapsulating composition at a suitable thickness as an applicator layer 42, and apply the encapsulating composition to an object positioned on the support structure 24. The applicator roll 20 is configured to rotate around the central axis 54. For example, the applicator roll 20 can rotate in the counter clock wise direction, as shown by the arrow 56, or in the clock wise direction, as shown by the arrow 58. The applicator roll 20 may be driven by a motor (not shown) and a rotational speed of the applicator roll 20 may be regulated using a control system to increase or decrease the rotational speed. The rotational speed may be selected such that the tangential speed of the applicator roll 20 is suitable, for example, at a suitable speed in relation to a linear speed of the support structure 24. In some embodiments, the applicator roll 20 is heated. For example, the applicator roll 20 may include heated coils or steam tubes inside the outer surface 36, or the system 10 may include a heating element (not shown) proximate the outer surface 36 of the applicator roll 20 to heat the applicator roll 20 and a material disposed on the outer surface 36. The outer surface 36 of the applicator roll 20 can be formed of any suitable material that provides the desired surface properties, including e.g., stainless steel, which may be uncoated or may be coated with a layer of an additional material such as rubber.

The support structure 24 is located proximate to the applicator roll 20. The support structure 24 transports an object, such as the substrate 32, past the applicator roll 20. In some embodiments, the support structure 24 is a unitary body, for example, a material having a planar surface that defines the support surface 25. In some embodiments, the support structure 24 includes a plurality of discrete surfaces that in combination form the support structure 24, such as a series of rollers located in sequence, for example, that an object can roll on past the applicator roll 20. The support structure 24 is configured to move an object along a first direction of travel, such as in the direction shown by the arrow 50. The support structure 24 optionally includes a mechanism for advancing an object at a suitable linear speed along the first direction of travel in relation to the applicator roll 20, for example, a motor to move the support structure 24 if it is a unitary body, or a series of motors if the support structure 24 includes a series of rollers.

The support structure 24 can be configured to move an object positioned along the support surface 25 in a tangential direction relative to the outer surface 36 of the applicator roll 20, such as along the direction shown by the arrow 50. For example, if the support structure 24 includes a unitary body, the support structure 24 can be configured such that the entire support surface 25 moves in relation to the applicator roll 20 and carries the substrate 32 past the applicator roll 20. If the support structure 24 includes a series of structures, such as a series of consecutive rollers, or a combination of rollers and platforms, the support structure 32 can be configured to move the substrate 32 along from one roller or platform to the next. In some embodiments, the support structure 24 can be controlled to move the substrate 32 horizontally at a suitable speed.

In some embodiments, the support structure 24 is configured to move up or down, i.e. in a radial direction in relation to the central axis 54 of the applicator roll 20, which is the direction shown by the arrow 52. In some embodiments, the elevator 26 is configured to move the support structure 24 toward or away from the applicator roll 20. That is, the elevator 26 can be configured to move the entire support structure 26 in the radial direction in relation to the central axis 54, such as along the direction shown by the arrow 52.

As shown in FIG. 2, the system includes a gap 38 defined between the outer surface 36 of the applicator roll 20 and the support structure 24 or an object positioned on the support structure 24. If the support structure 24 is free of objects along the support structure 24, the gap 38 is defined by the support surface 25 of the support structure 24 and the outer surface 36 of the applicator roll 20. If a substrate 32 is positioned between the support structure 24 and the applicator roll 20, the gap 38 is defined by the first surface 34 of the substrate 32 and the outer surface 36 of the applicator roll 20. In some embodiments, the elevator 26 can be controlled to move the support structure 32 toward or away from the applicator roll 20, such that the elevator 26 controls the size of the gap 38. In some embodiments, the elevator 26 can be controlled to move the support structure 24 toward or away from the applicator roll 20 while the support structure 24 is moving the substrate 32 past the applicator roll 20, such as in a direction tangent to the applicator roll 20.

In some embodiments, the elevator 26 is configured to control the distance of the support structure 24 from the applicator roll 20, for example, the distance from the applicator roll 20 in the radial direction, as shown by arrow 52. The elevator 26 can be configured to control the size of the gap 38 by moving the support structure 24 closer to or further away from the applicator roll 20. In some instances, the elevator 26 controls the size of the gap 38 such that the outer surface 36 of the applicator roll 20 does not directly contact the at least one of support structure 24 and an object on the support structure 24 such as the substrate 32. For example, the support structure can move the support structure 24 and control size of the gap 38 to be same as or less than the thickness of the applicator layer 42. In some instances, having the elevator 26 configured to help move the substrate 32 and any components positioned along the surface of the substrate 32 helps to the control size of the gap 38 to a defined distance between the applicator roll 20 and the substrate 32.

In some embodiments, the elevator 26 can be controlled to move the support structure 24 toward or away from the applicator roll as the substrate 32 is moving past the applicator roll 20. The system 10 optionally includes a sensor (not shown) or any suitable detection device that measures the height of the substrate 32 above the support surface 25 and the elevator 26 can be controlled to move the support structure 24 so that the size of the gap 38 between the first surface 34 of the substrate 32 and the outer surface 36 of the applicator roll 20 is controlled at a suitable size. For example, the sensor may detect that there are no objects positioned on the support structure 24, and the elevator 26 can move the support structure 24 such that the gap 38 is at a desired size. If an object, such as the substrate 32, is positioned on the support structure 24 and approaches the applicator roll 20, the sensor can detect the height of the substrate 32 and move the support structure 24 away from the applicator roll 20 so that the gap 38 between the substrate 32 and the applicator roll 20 is maintained at the desired size.

In some embodiments, the size of the gap 38 determines the thickness of the encapsulating composition that is applied to the component. When the applicator layer 42 contacts the substrate 32 it can transfer encapsulating composition to the substrate 32. As the applicator roll 20 continues to turn it continues applying encapsulating composition to the substrate 32. If the encapsulating composition is incompressible, the thickness of the first layer 44 is restricted by the size of the gap 38. For instance, because the encapsulating composition is incompressible, the thickness of the first layer 44 may be limited by size of the gap 38 as the height of the first layer 44 is inhibited from exceeding the height of the gap 38. In this manner, the applicator roll 20 spreads the encapsulating composition onto the substrate 32 and the gap 38 defines the height of the first layer 44. In some instances, the volumetric rate that the encapsulating composition is applied to the substrate is controlled by the rotational speed of the applicator roll 20, the length of the applicator roll 20, the thickness of the applicator layer 42, and the linear speed of the substrate 32.

As shown in FIG. 2, the nip roll 28 is positioned such that the support structure 24 is between the nip roll 28 and the applicator roll 20. The nip roll 28 can be controlled such that it can be moved closer to or further away from the applicator roll 20. The nip roll 28 can be adapted to rotate in a direction parallel to the applicator roll 20. That is, the nip roll 28 rotates about a central longitudinal axis that is parallel to the central axis 54 of the applicator roll. The nip roll 28 can be adapted to help the move the substrate 32 past the applicator roll 20, and to aid in biasing the substrate 32 towards or away from the applicator roll 20. For example, the nip roll 28 may cooperate with at least one of the elevator 26 and the support structure 32 to move the substrate 32 past the applicator roll 20 while helping to control the size of the gap 38. It is also envisioned that in some instances, the system 10 does not include the nip roll 28. For example, the nip roll 28 might not be included if the support structure 24 is moved in the direction of arrow 50.

The heating element 30 can be positioned proximate the support structure 24 at a suitable distance. The heating element 30 may be configured to provide heat to the substrate 32 and increase the temperature of at least one of the material of the substrate 32 and the material of the first layer 44 of encapsulating composition. The heating element 30 can be any suitable device that can be used to heat an object positioned on the support structure 24. In some embodiments, the heating element 30 is configured to provide hot air and to direct a flow of hot air to an object positioned on the support structure 24. In other embodiments, the heating element 30 is configured to provide heat through ambient thermal radiation, infrared radiation, or microwave radiation, and combinations thereof.

Figure 3:
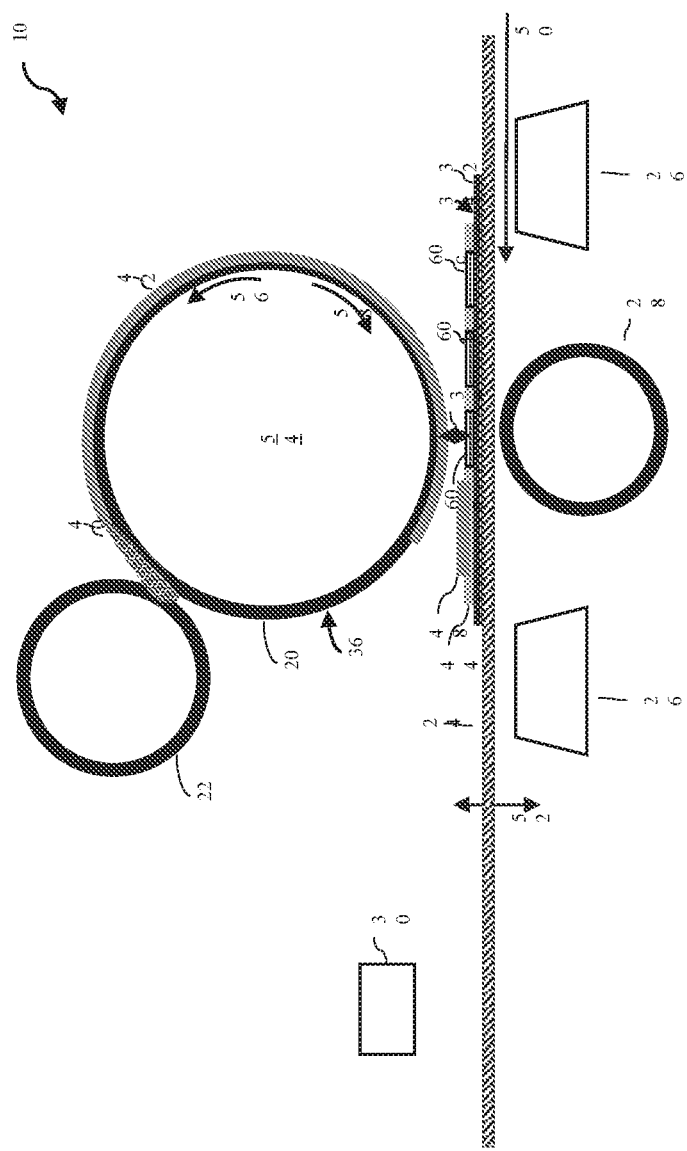
FIG. 3 is a schematic view of the system of FIG. 1, in accordance with certain embodiments.

As shown in FIG. 3, the system 10 can be used to apply an encapsulating composition on a first surface 34 of a substrate 32 positioned on a support structure 24. Additionally or alternatively, the system 10 can be used to apply encapsulating composition on components 60a, 60b, 60c positioned on the substrate 32.

In some embodiments, the system 10 applies a first layer 44 of encapsulating composition onto a first component 60a, for example directly onto the first component 60a and onto portions of the substrate 32 around the first component 60a.

The applicator roll 20 is spaced apart from the first component 60a such that a gap 38 is formed between the applicator roll 20 and the first component 60a. The size of the gap 38 controls the thickness of the first layer 44 of encapsulating composition. In some instances, controlling additional parameters of the system 10, such as the rotational speed of the applicator roll 20, can aid in controlling the thickness of the first layer 44. In some embodiments, the first layer 44 of encapsulating composition encapsulates the first component 60a on the substrate 32. That is, the first layer 44 completely covers the first component 60a and encapsulates it with the substrate 32 positioned on a first side of the first component 60a and encapsulating composition on the remaining sides of the first component 60a. In some embodiments, the applicator roll 20 is configured to apply the encapsulating composition at an application temperature from about 120° C., about 130° C., or about 140° C., to about 150° C., about 160° C., about 170° C., or about 200° C., or a temperature between any pair of the foregoing values, although additional temperatures are further contemplated.

The system 10 can be used to apply multiple layers of encapsulating composition on a component. The system 10 can apply a second layer 48 of encapsulating composition directly onto the first layer 44, the first component 60a, and combinations thereof. The applicator roll 20 applies the first layer 44 on a first component 60a positioned on the substrate 32. Then the substrate 32 and the coated first component 60a are passed through the system 10 again and a second layer 48 of encapsulating composition is applied on the surface of the first layer 44, the first component 60a, or both. In some embodiments, a processing line includes multiple systems 10 arranged in line, such that the first component 60a is passed through a first embodiment of the system 10 where the first layer 44 is applied, which is then passed through a second system 10 located downstream from the first system 10, and the second layer 48 is applied by the second system 10. The first and second systems 10 can be the same or different. The encapsulating compositions used to form the first 44 and the second layers 48 can be of the same or different compositions.

The support structure 24 moves the substrate 32 past the applicator roll 20 in the direction shown by the arrow 50 while the encapsulating composition is being applied. The applicator layer 42 can be brought in contact with the substrate to be coated or the component to be encapsulated and apply encapsulating composition to form the first layer 44 of encapsulating composition. As the substrate 32 moves in the direction shown by the arrow 50, the elevator 26 can simultaneously move the substrate 26 along the direction shown by arrow 52 and control the size of the gap 38. The elevator 26 can move the support structure 24 such that the size of the gap 38 is controlled at a consistent size as the components 60a, 60b, 60c pass the applicator roll 20. As an example, the elevator 26 can move the support structure 24 closer to the applicator roll 20 as the portion of the substrate 32 without the first component 60a passes, such that the size of the gap 38 between the first surface 34 of the substrate 32 is a suitably defined distance. As the first component 60a passes the applicator roll 20 the elevator 26 can move the support structure 24 away from the applicator roll 20 to maintain the size of the gap 38 at the suitably defined distance. The elevator can 26 move the support structure 24 farther away from the applicator roll 20 as the second component 60b and third component pass 60c such that the size of the first layer 44 is the same over the components 60a, 60b, and 60c as over the portions of the substrate 32 in between or around the 60a, 60b, and 60c, in some instances, the elevator 26 is held at a constant height such that the size of the gap 38 between the support structure 24 and the applicator roll 20 stays the same as the substrate 32 moves past the applicator roll 20. For example, the support structure 24 can move the substrate 32 and the first component 60a past the applicator roll 20 which applies the encapsulating composition and removes any excess encapsulating composition such that the first layer 44 defines a generally planar surface over the components 60a, 60b, and 60c and the substrate 32, In some embodiments, the thickness of the first layer 44 may be from about 0.01 mm, about 0.02 mm, about 0.05, or about 0.1 mm, to about 0.2 mm, about 0.2 mm, 0.5 or about 1 mm, or a size between any pair of the foregoing values, although embodiments where the first layer has additional thicknesses are further contemplated. In some embodiments, a preferred thickness of the first layer is from about 0.05 to about 0.2 mm.

As the substrate 32 is moving past the applicator roll 20 the applicator roll 20 can be controlled to turn in either of the clockwise direction shown by the arrow 58, or the counter clockwise direction, shown by the arrow 56. In some embodiments, having the applicator roll 20 turn in the direction shown by the arrow 56, or counter to the direction of travel of the substrate 32, helps to drive out substances that may form voids in the encapsulating composition, such as air, by pressing the encapsulating composition against the object to be encapsulated. For example, turning the applicator roll 20 in the counter clockwise direction as shown in FIG. 2, applies encapsulating composition to the component to be encapsulated and the substrate 32, and rotating the applicator roll 20 at a suitable speed such that encapsulating composition is applied at a suitable rate may help drive out air that may be trapped between the component to be encapsulated and the substrate 32. In some embodiments, the applicator roll 20 can be controlled to turn in the clockwise direction, shown by the arrow 58, and a tangential speed of the applicator roll 20 can be controlled to be greater than or less than the linear speed of the substrate in the direction shown by the arrow 50. For example, controlling the rotational speed of the applicator roll 20 such that the tangential speed of the outer surface 36 is suitably greater than the linear speed of the substrate 32 can provide encapsulating composition at a suitable rate such that the applicator roll 20 can press or manipulate the encapsulating composition against the component to be encapsulated and drive out substances that may form voids, such as air. Because the encapsulating composition is incompressible, if the applicator roll 20 provides the encapsulating composition to the component to be encapsulated at a suitable rate, the applicator roll 20 can press or manipulate the encapsulating composition against the component to be encapsulated, while the gap 38 is maintained.

The encapsulating composition can be applied to the component to be encapsulated without the applicator roll 20 contacting the component to be encapsulated. In some instances, applying encapsulating composition without the applicator roll 20 contacting the component to be encapsulated helps encapsulate a component that may be damaged by contacting the applicator roll 20, such as a fragile component, for example certain electronic components. Having the applicator roll 20 press or manipulate the encapsulating composition against the component to be encapsulated can help apply the encapsulating composition substantially free of voids. The system 10 can be used to apply the first layer 44, second layer 48, and optionally a third, fourth or more layers of encapsulating composition such that an interface between the encapsulating composition and the components 60a, 60b, 60c, is substantially free of voids. In some embodiments, the components 60a, 60b, 60c, are encapsulated within the encapsulating composition and the encapsulating composition is substantially free of voids.

In some embodiments, after the encapsulating composition has been applied to the component to be encapsulated the encapsulating composition may be smoothed, such as by heating. For example, the encapsulating composition can be heated to a suitable temperature, such as above its glass transition temperature, which can help smooth or level the encapsulating composition. For example, the first layer 44 may be heated by passing it under the heating element 30. In some embodiments, the encapsulating composition can be heated by heating the construction in an oven. For example, a substrate 32 that includes the encapsulating composition disposed thereon can be placed in an oven capable of heating the encapsulating composition to a temperature and for a period of time suitable to cause the composition to soften and level. In other embodiments, the encapsulating composition may be smoothed by leveling it with a smoothing device, such as a doctor blade, that optionally is heated.

Figure 4:
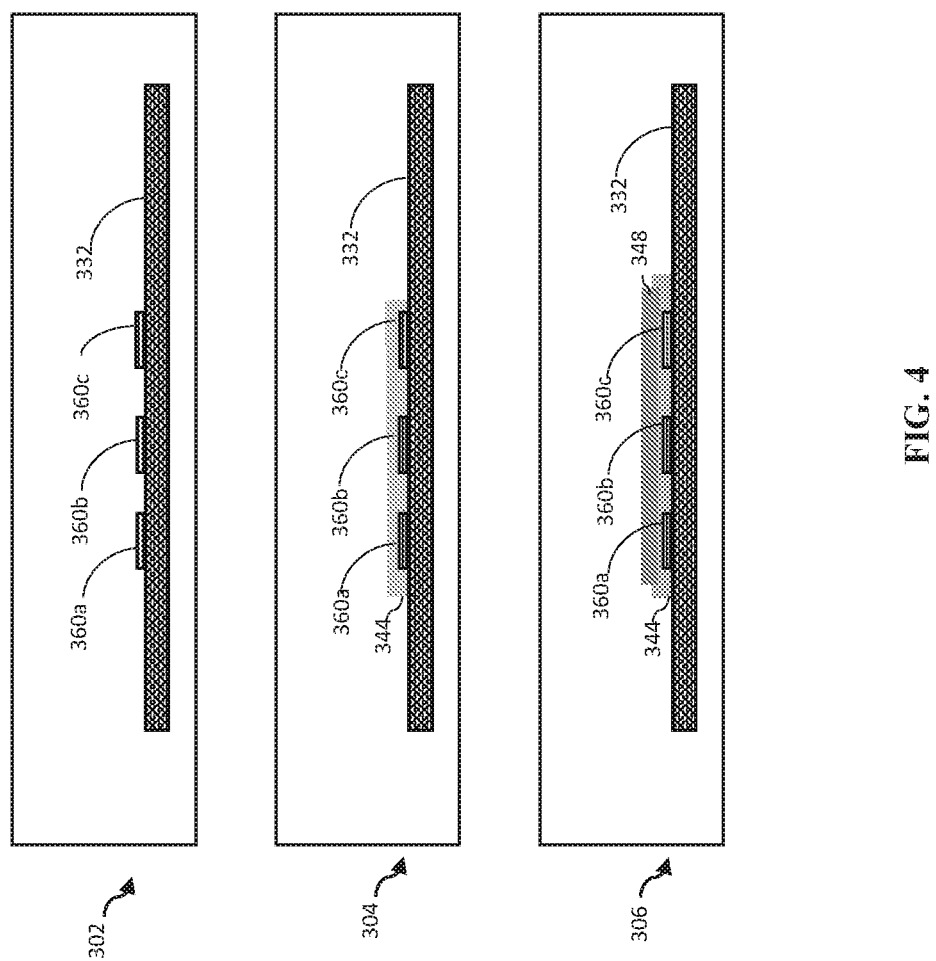
FIG. 4 is a schematic view of certain components of the system of FIG. 1 at various stages of an example process, in accordance with some embodiments.

FIG. 4 shows an example process for applying encapsulating composition to a component to be encapsulated. The process shown in FIG. 4 may be carried out using the system 10 shown in FIGS. 2 and 3. In step 302, one or more components 360a, 360b, 360c may be positioned on a substrate 332. In step 304, a first layer 344 of encapsulating composition has been applied on the substrate and the components 360a, 360b, 360c. After step 304, the first layer 344 optionally may be smoothed. In step 306, a second layer 348 of encapsulating composition has been applied on the first layer 344. In some embodiments, further steps may be included to add a third, fourth, or more layers of encapsulating composition onto the components 360*a*, 360*b*, 360*c*, until encapsulating composition having a suitable total thickness has been applied.

Figure 5:
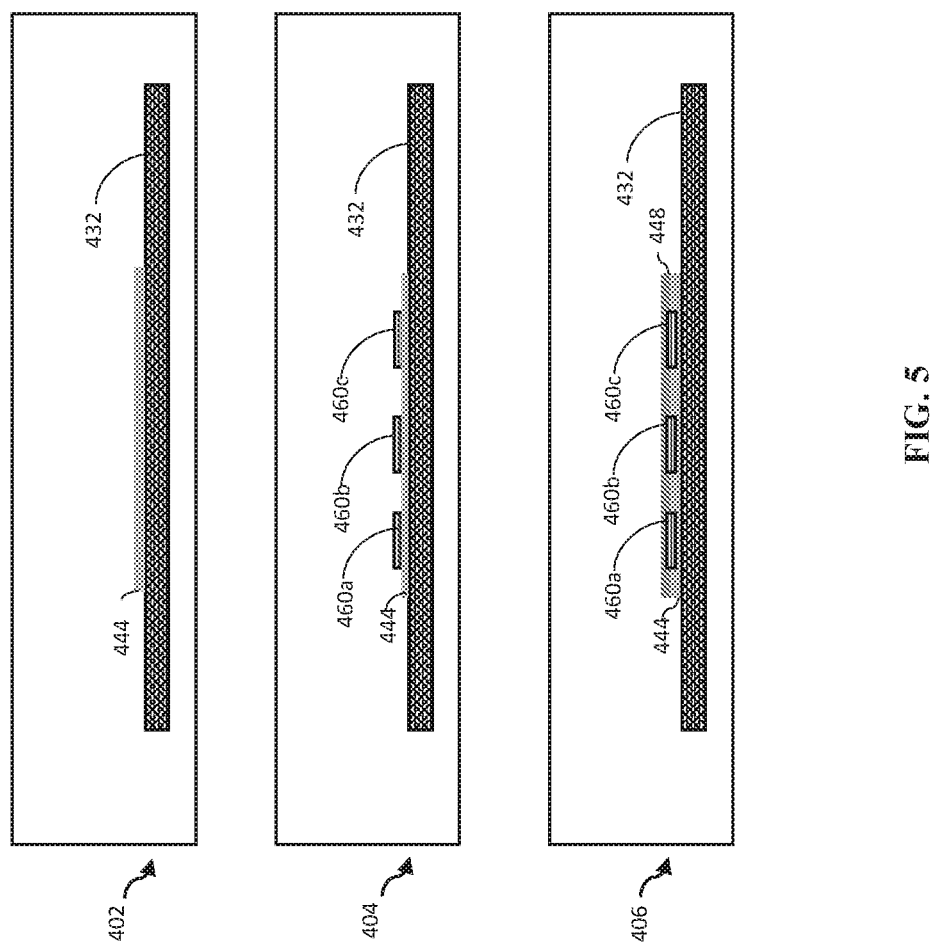
FIG. 5 is a schematic view of certain components of the system of FIG. 1 at various stages of an example process, in accordance with some embodiments.

As shown in FIG. 5, in step 402, a first layer 444 of encapsulating composition has been applied directly on and in contact with a substrate 432. After step 402, the first layer 444 optionally is smoothed. In step 404, components 460*a*, 460*b*, 460*c* are positioned on the first layer 444 such that they "float" above the substrate because they are not in direct contact with the substrate 432. In step 406, the second layer 448 of encapsulating composition has been applied onto the first layer 444 and the components 460*a*, 460*b*, 460*c*. In some embodiments, the components 460*a*, 460*b*, 460*c* are completely enclosed within the first layer 444 and second layer 448 of encapsulating composition. In some embodiments, further steps may be included to add a third, fourth, or more layers of encapsulating composition onto the components 460*a*, 460*b*, 460*c*, until encapsulating composition having a suitable total thickness has been applied.

Figure 6:
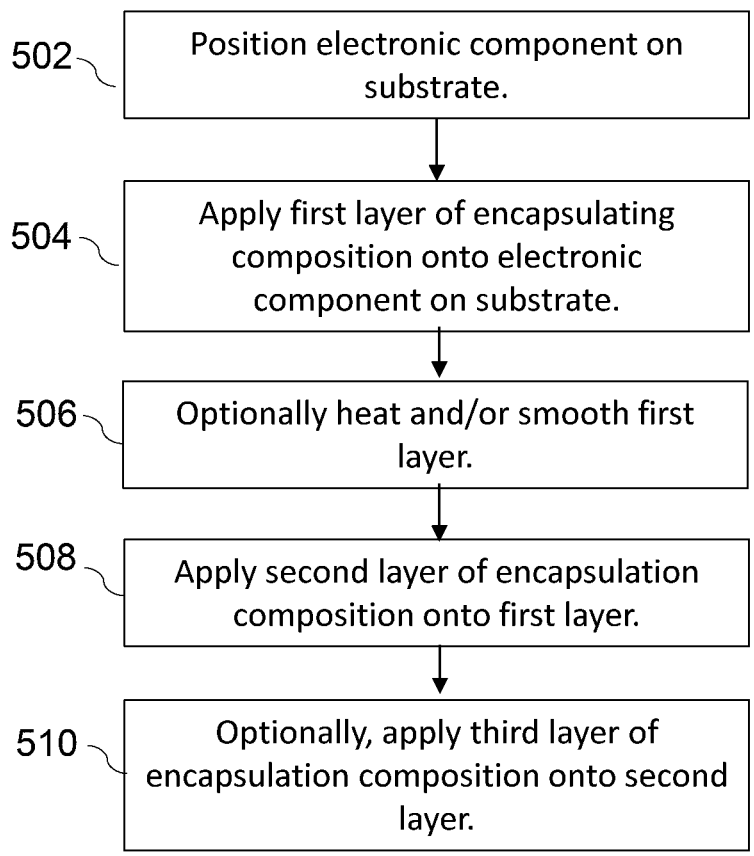
FIG. 6 is an exemplary flow chart of a process that can be used with the system of FIG. 1, in accordance with some embodiments.

FIG. 6 shows a flow chart illustrating an example process for applying encapsulating composition to a component to be encapsulated. The process shown in FIG. 6 may be carried out using the system 10 shown in FIGS. 2 and 3. In step 502, one or more electronic components may be positioned on a substrate. In step 504, a first layer of encapsulating composition is applied onto the electronic component. The system 10 shown in FIGS. 2 and 3 may be used to apply encapsulating composition. The system 10 can be used to apply the first layer of encapsulating composition such that an interface between the encapsulating composition and the electronic component is substantially free of voids. In some examples, in step 506 the first layer optionally may be smoothed. Useful methods of smoothing include, e.g., heating the encapsulating composition, using a smoothing device such as a doctor blade, and combinations thereof. In step 508, a second layer of encapsulating composition is applied. The second layer of encapsulating composition is applied onto the first layer. In some embodiments, step 510 may be included to add a third, fourth, or more layers of encapsulating composition onto the electronic component until encapsulating composition having a suitable total thickness has been applied.

Figure 7:
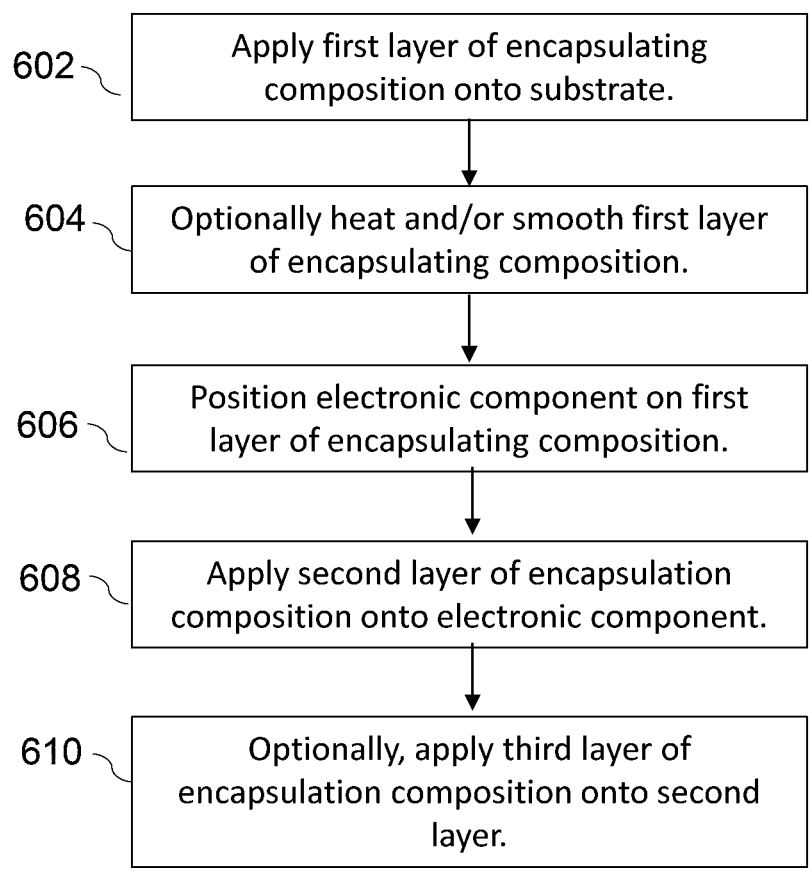
FIG. 7 is an exemplary flow chart of a process that can be used with the system of FIG. 1, in accordance with some embodiments.

FIG. 7 shows a flow chart illustrating another example process for applying encapsulating composition to a component to be encapsulated, such an electronic component. The process disclosed in FIG. 7 can be carried out using the system 10 shown in FIGS. 2 and 3. In step 602, a first layer of encapsulating composition is applied to a substrate. In some examples, in step 604 the first layer optionally may be smoothed. Useful methods of smoothing include, e.g., heating the encapsulating composition, using a smoothing device such as a doctor blade, and combinations thereof. In step 606, one or more electronic components may be positioned on the first layer of encapsulating composition that was applied in step 602. In step 608, a second layer of encapsulating composition is applied onto the electronic component positioned on the first layer. The system 10 can be used to apply the second layer of encapsulating composition such that an interface between the encapsulating composition and the electronic components is substantially free of voids. The second layer of encapsulating composition may be applied onto the electronic component such that the electronic component is completely encapsulated in the encapsulating composition and the encapsulating composition is substantially free of voids. In some embodiments, the electronic component may be completely enclosed within the first layer and second layer of encapsulating composition and positioned on a surface of a substrate such that the component "floats" above the surface of the substrate. In some embodiments, step 610 may be included to add a third, fourth, or more layers of encapsulating composition onto the electronic component until encapsulating composition having a suitable total thickness has been applied.

Encapsulating Composition

The encapsulating composition is in the form of a liquid prior to application to the component and solidifies after being applied to (e.g., coated on) the substrate to be coated. Depending on the chemical nature of the encapsulating composition, solidification of the encapsulating composition can occur through a variety of mechanisms including, e.g., curing, hardening upon cooling to room temperature (from 22° C. to 25° C.), and combinations thereof. Curing, which is also known as crosslinking, can occur through exposure to ultraviolet light radiation, electron beam radiation, heat (i.e., thermal radiation), chemical additives, and combinations thereof.

For thermoplastic encapsulating compositions, the encapsulating composition becomes a liquid when heated to the coating temperature (i.e., the temperature of the composition prior to being released from the applicator roll (also referred to herein as the application temperature)). Useful coating temperatures include temperatures no greater than 190° C., no greater than 160° C., no greater than 140° C., no greater than 120° C., or even no greater than 100° C.

The encapsulating composition preferably exhibits a viscosity from about 1,000 centipoise (cp), about 5,000 cp, about 10,000 cp, or about 50,000 cp, to about 700,000 cp, about 800,000 cp, about 900,000, or about 1,000,000 cp at the coating temperature, at greater than about 160° C., or even at greater than 190° C., or a viscosity between any pair of the foregoing values.

Useful encapsulating compositions exhibit a shear viscosity from about 1,000, about 5,000, or about 10,000 cp, to about 50,000, about 75,000 cp, or about 100,000 cp, or a shear viscosity between any pair of the foregoing values, at a temperature equal to or greater than about 190° C. Useful encapsulating compositions exhibit a melt index from about six g/10 min, about 20 g/10 min, about 100 g/10 min, about 200 g/10 min, or about 300 g/10 min, to about 800 g/10 min, about 900 g/10 min, to about 1,000 g/10 min, or a melt index between any pair of the foregoing values, as measured at about 230° C. and 2.16 kilograms.

The solidified encapsulating composition can exhibit a variety of optical properties including, e.g., being translucent, transparent, and/or opaque; and where multiple layers of solidified encapsulating composition are present, the individual layers can independently exhibit any of the aforementioned optical properties. Encapsulating compositions that are particularly useful for encapsulating photovoltaic cells include substantially transparent or even transparent encapsulating compositions.

The solidified encapsulating composition also can be electronically conducting or electronically nonconducting. Where multiple layers of encapsulating composition are present in an encapsulated article, the individually layers can independently be electronically conducting or electronically nonconducting.

Suitable classes of encapsulating compositions include, e.g., thermoplastic compositions, hot melt adhesive compositions, radiation curable adhesive compositions, and combinations thereof. Useful thermoplastic compositions and hot melt adhesive compositions are based on a variety of classes of thermoplastic polymers including, e.g., moisture curable thermoplastic polymers (e.g., silane modified thermoplastic polymers), radiation curable thermoplastic polymers (e.g., ultraviolet light curable and electron beam curable thermoplastic polymers), peroxide curable thermoplastic polymers, and combinations thereof.

Specific examples of suitable thermoplastic polymers include polyolefin homopolymers and copolymers (e.g., polyethylene, polypropylene, polybutene, and combinations thereof), metallocene catalyzed polyolefins (e.g., metallocene catalyzed polypropylenes), ethylene vinyl acetate, amorphous polyalphaolefins, polyisobutylenes, and combinations thereof. Suitable commercially available thermoplastic polymers include, e.g., polymers available under the VISTAMAXX series of trade designations from ExxonMobil (Irving, Texas) including VISTAMAXX 8880 metallocene-catalyzed propylene-ethylene copolymer, and ethylene vinyl acetate copolymers available under the ATEVA series of trade designations from Celanese Corporation (Irving, Texas) including ATEVA ethylene vinyl acetate copolymers (e.g., ATEVAs that include 28% vinyl acetate and have a melt index of 6 g/10 min, e.g., ATEVA 2810A and ATEVA 2861A).

Useful moisture curable silane-modified thermoplastic polymers include, e.g., silane-modified amorphous polyolefins, silane-modified metallocene-catalyzed polyolefins (e.g., silane-modified metallocene-catalyzed polyethylene, polypropylene, polybutene, and copolymers thereof), silane-modified acrylate polymers (e.g., silane-modified ethyl acrylate, silane-modified butyl acrylate, and combinations thereof), and combinations thereof. Suitable moisture curable silane-modified thermoplastic polymers are commercially available under a variety of trade designations including, e.g., under the VESTOPLA ST series of trade designations from Evonik Industries (Essen, Germany) including VESTOPLAST 206.

Useful radiation curable polymers and compositions include, e.g., acrylate-based radiation curable compositions, acrylate-terminated polyesters, radiation curable vinyl modified block copolymer compositions (e.g., those radiation curable adhesive compositions described in U.S. Pat. No. 6,579,915 and incorporated herein), and combinations thereof. Useful radiation curable polymers and compositions are commercially available under a variety of trade designations including, e.g., the ACRESIN series of trade designations from BASF SE (Ludwigshafen, Germany) including ACRESIN A 204 UV, ACRESIN A 250 UV, ACRESIN A 260 UV and ACRESIN UV 3532, the KRATON series of trade designations from Shell Chemical Company (Houston, Texas) including KRATON D-KX-222C, and the SR series of trade designations from Firestone Polymers, LLC (Akron, Ohio) including SR-8272 and SR-8273. Useful peroxide curable adhesive compositions include, e.g., compositions that include a peroxide crosslinking agent and ethylene vinyl acetate copolymer.

Encapsulating compositions in the form of hot melt adhesive compositions optionally additionally include tackifying, agents, plasticizers, waxes, photo initiators, crosslinking agents, antioxidants, stabilizers, additional polymers, adhesion promoters, ultraviolet light stabilizers, rheology modifiers, corrosion inhibitors, and combinations thereof.

Article

Figure 8:
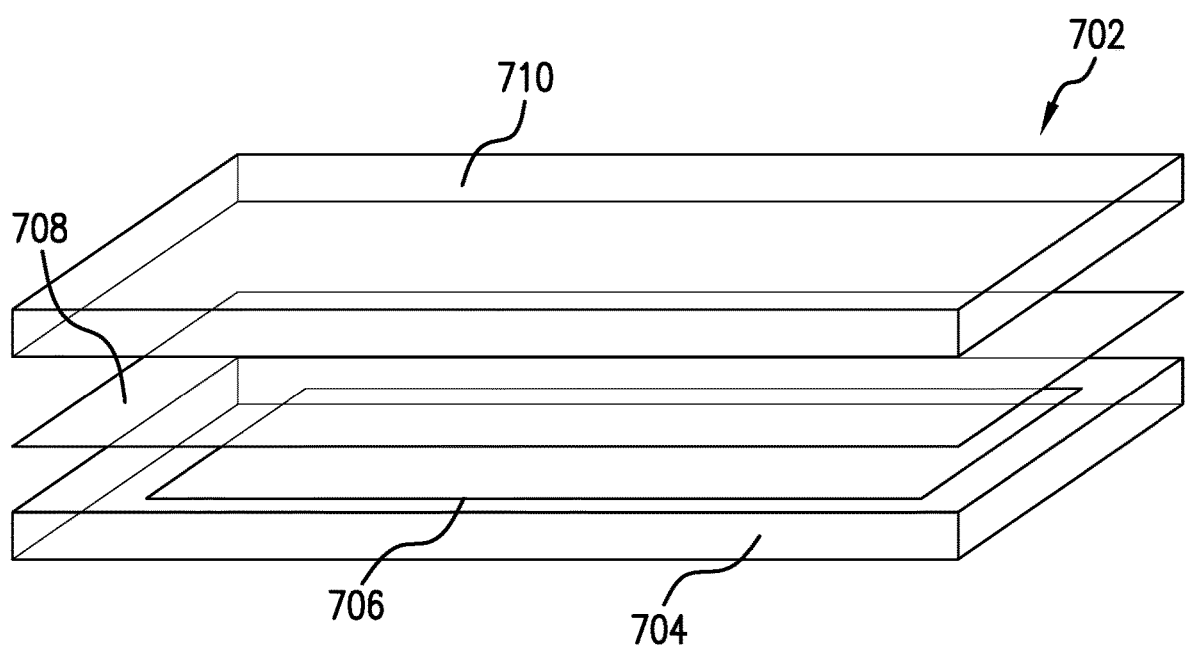
FIG. 8 is an exploded view of an exemplary device that a be formed with the system of FIG. 1, in accordance with some embodiments.

FIG. 8 is an exploded view of a sample article 702 that may be formed using the systems and processes disclosed herein. The article 702 can be an electronic device, e.g., a photovoltaic array, such as for absorbing solar energy and converting the solar energy to drive an electric current. As shown in FIG. 7, the article 702 includes a substrate layer 704, an electronic component layer 706, an encapsulation layer 708, and an optional top layer 710. The substrate layer 704 can be formed from any suitable material that can form a backing for a solar panel, such as any suitable backing for a photovoltaic array. In some embodiments, the substrate layer 704 includes silicon, glass, metal, polymer, or a combination thereof. In some embodiments, the electronic component layer 706 includes devices that produce an electric current when exposed to sunlight. For example, the electronic component layer 706 can include at least one photovoltaic cell. The encapsulation layer 708 can be applied to at least one of the electronic component layer 706, the substrate layer 704, and the optional top layer 710, and can adhere to at least one of the electronic component layer 706, the substrate layer 704, and the optional top layer 710.

The encapsulation layer 708 may be useful in encapsulating the electronic component layer 706 and protecting it from damage and moisture and may be useful in electrically isolating the electronic component layer 706. The encapsulation layer 708 may have a certain degree of flexibility, for example, it can be configured to allow expansion and contraction of the electronic component layer 706 while protecting the electronic component layer 706. Optionally the encapsulation layer 708 is sufficiently flexible to allow the device 702 to be rolled up in some embodiments, the optional top layer 710 may be included to further protect the electronic component layer 706. The top layer 710 can be formed from any suitable material that is transparent and that will allow visible light, ultraviolet light, or any form of solar energy to pass through and contact the electronic component layer 706. Suitable materials for the top layer 710 include, e.g., glass and plastic (e.g., polycarbonate).

The methods and systems disclosed herein provide an encapsulation process that does not require heating the pre-formed film in an oven to melt and encapsulate the components, which allows for elimination of this step during processing. Additionally or alternatively, the coat weight of the encapsulation layer can be reduced to less than that formed when using a pre-formed film layer.

It is envisioned that using the systems and methods disclosed herein, durable electronic devices, such as photovoltaic arrays having a greater overall area than are currently possible can be produced. The systems and methods disclosed herein are useful for forming electronic devices that have encapsulation layers that are thinner than what currently can be produced. Such electronic devices can be formed from multiple layers, and each of the layers may be flexible. In some aspects, an electronic device formed from the systems and methods disclosed herein may be flexible enough to be rolled up, for example to be transported.

EXAMPLES

The following non-limiting examples are included to further illustrate various embodiments and are not intended to limit the scope of the instant disclosure.

Substrate 1: transparent window glass plates 120 mm long by 100 mm wide by three mm thick.

Substrate 2: front glass plates, 225 mm long by 200 mm wide by three mm thick, commonly used for forming solar panels. The front glass plates are flat on the outer side and have a three dimensional antireflection surface on the inner, coated side.

Substrate 3: glass roof shingles, 360 mm long by 220 mm wide by five mm thick, that are flat on the outer side and structured on the inner, coated side.

Substrate 4: BAYER MAKROLON polycarbonate plates (Covestro, Leverkusen, Germany) 250 mm long by 100 mm wide by 0.5 mm thick.

Substrate 5: BAYER MAKROLON polycarbonate plates 250 mm long by 100 mm wide by one mm thick.

Encapsulating Composition 1: VISTAMAXX 8880 metallocene catalyzed polypropylene (ExxonMobil, Irving, Texas).

Encapsulating Composition 2: ATEVA 2810 ethylene vinyl acetate including 28% vinyl acetate and having a melt index of six g/10 min (Celanese Corporation, Irving, Texas).

Encapsulating Composition 3: VESTOPLAST 206 silane modified amorphous poly alpha olefin (Evonik Industries, Essen, Germany).

Component 1: photovoltaic cells 100 mm long by 40 mm wide by 0.2 mm thick.

Component 2: 200 mesh filter plates 58 mm in diameter and approximately 0.2 mm thick.

Example 1

The encapsulated article of Example 1 was prepared using a HARDO T150 application system (Hardo, Bad Salzuflen, Germany) that included a main tank, mixing rolls, an applicator roll, and a doctor blade to apply Encapsulating Composition 3 on Substrate 4, The mixing rolls were set to 140° C. The doctor blade was positioned such that the distance from the doctor blade to the applicator roll was 0.45 mm. The size of the gap between the applicator roll and Substrate 4 was 0.2 mm.

To prepare the encapsulated article of Example 1, Encapsulating Composition 3 was heated to a temperature of 140° C. until it was completely molten and in the form of a liquid. Substrate 4 was then passed at a linear rate of 3.5 meters per minute (m/min) to the applicator roll while being supported from underneath in such a manner that Substrate 4 passed as horizontally as possible under the applicator roll. As Substrate 4 passed under the applicator roll, Encapsulating Composition 3 was coated on Substrate 4 to form an encapsulation layer having a thickness of 0.2 mm. The encapsulation layer was then smoothed and leveled by passing hot air from a hot air gun over the layer. A smooth, uniform layer of encapsulating composition having a measured thickness of 0.2 mm was formed. The layer of encapsulating composition was visually checked with a digital microscope (Keyence VHX 2000, St. Louis Park, MN). The layer of encapsulating composition was observed to be free of voids.

Example 2

The encapsulated article of Example 2 was prepared in substantially the same manner as described above in Example 1 with the exception that after the encapsulation layer was formed on Substrate 4, a thin film solar array, 100 mm long by 40 mm wide by 0.2 mm thick, was placed on the encapsulation layer while it was still hot.

The size of the gap between the substrate and the applicator roll, was then set to 0.4 mm and the substrate with the thin film solar array positioned on top of the encapsulation layer was passed under the applicator roll of the HARDO T150 application system and Encapsulating Composition 3 was applied on the thin film solar array so as to encapsulate the thin film solar array with a layer of Encapsulating Composition 3. The resulting construction was passed through the system two additional times during which two additional layers of Encapsulating Composition 3 were applied to the construction. Before the second and third passes, the gap between the substrate and the applicator roll was increased to 0.6 mm and then to 0.8 mm, respectively.

The resulting encapsulating layer was visually checked with a digital microscope (Keyence VHX 2000, St, Louis Park, MN). The visual inspection confirmed that the thin film solar array that had been encapsulated with multiple coatings and the encapsulation layer was substantially void free.

Figure 9:
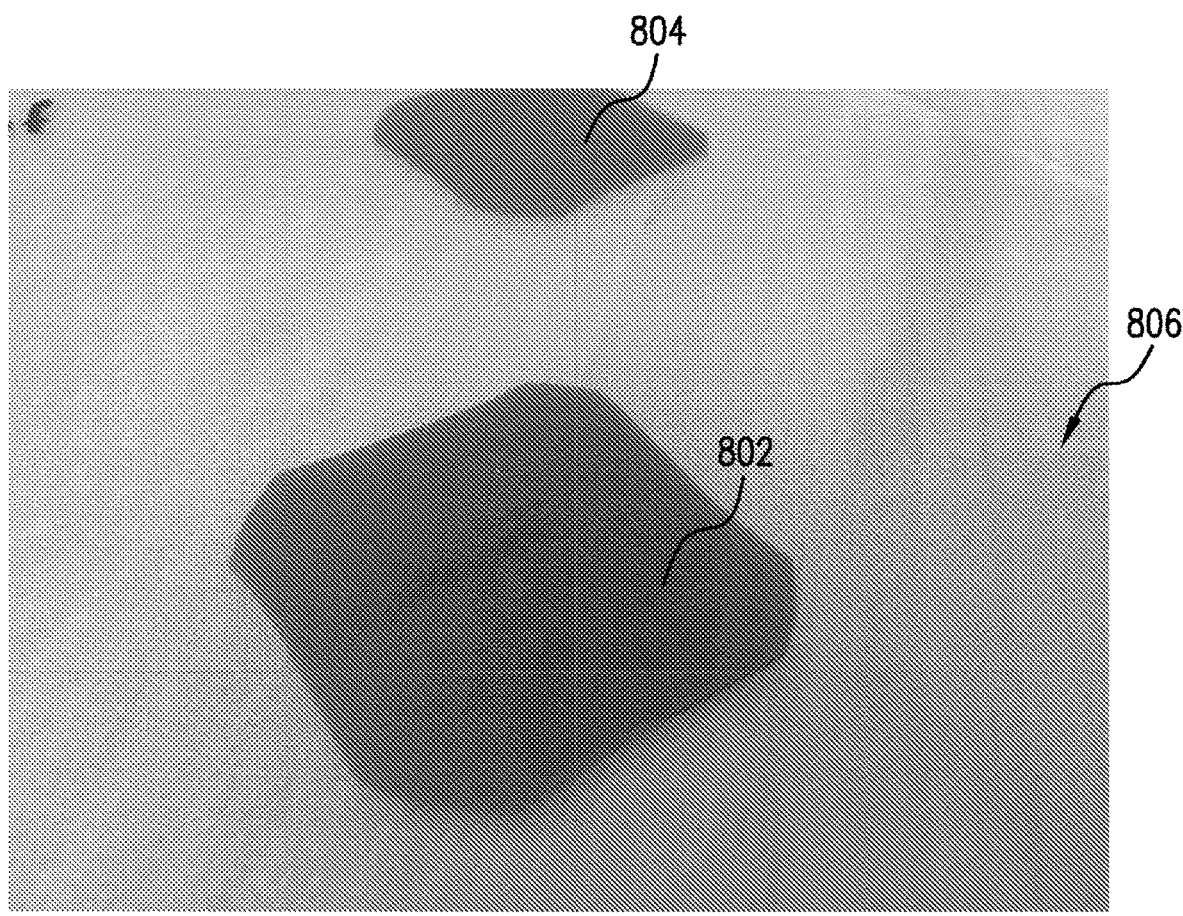
FIG. 9 is a photograph of an exemplary device formed with the systems and methods disclosed herein, in accordance with some embodiments.

FIG. 9 shows an example component from Example 2 that was encapsulated using the systems and methods disclosed herein. As shown in FIG. 9, a first component 802 and a second component 804 were completely encapsulated in an encapsulating composition 806 using the equipment and materials disclosed in Examples 1 and 2.

Figure 10:
FIG. 10 is a photograph of an exemplary device formed with the systems and methods disclosed herein, in accordance with some embodiments.

FIG. 10 shows an example encapsulating composition (VESTOPLAST 206 (from Evonik Industries, located in Essen, Germany)) applied using the systems and methods of Examples 1 and 2. The first sample 902 was applied with the applicator roll turning in the same direction as the substrate was traveling. The first sample 902 had a rough surface, marked by ridges. In one explanation, it is believed that the ridges may have been the result of air entrapment between the surface of the applicator roll and the encapsulating composition. The rough, stripes are caused by the flow performance of the encapsulating composition. The uneven wave-like structure is believed to be caused by the applicator roll surface. Even with the rough surface that is shown in FIG. 9, the encapsulating composition was substantially free of voids. The second sample 904 was applied with the applicator roll turning in the opposite direction as the substrate was traveling, a technique also referred as reverse roll coating. As shown in FIG. 9, coating in the reverse direction, with the surfaces of the applicator roll and the substrate traveling in opposite directions, results in a smoother surface than the first sample 902.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the above described features.

What is claimed is:

1. A method of encapsulating an electronic component, the method comprising:
   applying a first layer of an encapsulating composition onto an electronic component from an applicator roll, the electronic component being disposed on a substrate,
   the applicator roll comprising an outer surface and being spaced apart from the electronic component such that a gap exists between the applicator roll and the electronic component, the gap controlling the thickness of the first layer of encapsulating composition,
   the first layer of encapsulating composition encapsulating the electronic component on the substrate, and
   an interface between the surface of the electronic component and the encapsulating composition being substantially free of voids.

2. The method of claim 1, wherein applying the first layer includes passing the substrate past the applicator roll and turning the applicator roll in the same direction as a direction of travel of the substrate.

3. The method of claim 2, wherein a tangential speed of the applicator roll is greater or less than a linear speed of the substrate.

4. The method of claim 1, wherein applying the first layer includes passing the substrate past the applicator roll in a first direction and turning the applicator roll in a direction opposite the first direction.

5. The method of claim 1, wherein the encapsulating composition is at a temperature of from about 120° ° C. to about 170° C. prior to contact with the electronic component.

6. The method of claim 1, wherein the encapsulating composition is at least one of polypropylene, ethylene vinyl acetate, and an amorphous poly alpha olefin.

7. The method of claim 1, wherein the encapsulating composition is applied as a liquid.

8. A method of encapsulating an electronic component on a surface of a substrate, the method comprising:
applying a first layer of an encapsulation composition onto a substrate from an applicator roll, the applicator roll comprising an outer surface and being spaced apart from the substrate such that a gap exists between the applicator roll and the substrate, the gap controlling the thickness of the first layer of encapsulation composition,
positioning an electronic component on the first layer of encapsulation composition; and
applying a second layer of encapsulation composition onto the electronic component from the applicator roll, such that the electronic component is encapsulated within the encapsulating composition and the encapsulating composition is substantially free of voids.

9. The method of claim 8, wherein applying the second layer of encapsulating composition includes controlling the size of a gap defined between an outer surface of the applicator roll and the surface of the substrate, such that the applicator roll does not contact the electronic component.

10. The method of claim 8, wherein applying the first layer of encapsulating composition includes passing the substrate past the applicator roll in a first direction and turning the applicator roll in the same direction as the first direction.

11. The method of claim 10, wherein a tangential speed of the applicator roll is greater or less than a linear speed of the substrate.

12. The method of claim 8, wherein applying the first layer of encapsulating composition includes passing the substrate past the applicator roll in a first direction and turning the applicator roll in a direction opposite the first direction.

13. The method of claim 8, wherein the encapsulating composition is at a temperature of from about 120° C. to about 170° C. prior to contact with the electronic component.

14. The method of claim 8, wherein the encapsulating composition is applied as a liquid.

* * * * *